US010361129B1

(12) United States Patent
Sieg et al.

(10) Patent No.: US 10,361,129 B1
(45) Date of Patent: Jul. 23, 2019

(54) SELF-ALIGNED DOUBLE PATTERNING FORMED FINCUT

(71) Applicant: INTERNATIONAL BUSINESS MACHINES CORPORATION, Armonk, NY (US)

(72) Inventors: Stuart A. Sieg, Albany, NY (US); Yann Mignot, Slingerlands, NY (US); Christopher J. Waskiewicz, Rexford, NY (US); Hemanth Jagannathan, Niskayuna, NY (US); Eric Miller, Watervliet, NY (US); Indira Seshadri, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/983,907

(22) Filed: May 18, 2018

(51) Int. Cl.
*H01L 21/30* (2006.01)
*H01L 21/8234* (2006.01)
*H01L 21/308* (2006.01)
*H01L 21/3065* (2006.01)
*H01L 27/088* (2006.01)

(52) U.S. Cl.
CPC .. *H01L 21/823487* (2013.01); *H01L 21/3065* (2013.01); *H01L 21/3081* (2013.01); *H01L 21/3086* (2013.01); *H01L 21/3088* (2013.01); *H01L 21/823412* (2013.01); *H01L 27/088* (2013.01)

(58) Field of Classification Search
CPC ............. H01L 21/3086; H01L 21/3081; H01L 21/0332; H01L 21/0337; H01L 21/823431
See application file for complete search history.

(56) References Cited

U.S. PATENT DOCUMENTS

| 8,735,296 | B2 | 5/2014 | Jung et al. |
| 8,883,649 | B2 | 11/2014 | Yin et al. |
| 9,287,135 | B1 | 3/2016 | Doris et al. |
| 9,431,265 | B2 | 8/2016 | Cheng et al. |
| 9,466,534 | B1 * | 10/2016 | Brink .............. H01L 21/823431 |
| 9,761,450 | B1 | 9/2017 | Bi et al. |
| 9,779,960 | B2 | 10/2017 | Xie et al. |
| 9,780,197 | B1 | 10/2017 | Xie et al. |
| 9,852,916 | B2 | 12/2017 | Chen et al. |
| 9,997,369 | B2 * | 6/2018 | Karve ................ H01L 21/0337 |
| 2017/0250088 | A1 | 8/2017 | Derderian |

OTHER PUBLICATIONS

Raley, "Self-Aligned Blocking Demonstration for Critical sub 40nm pitch Mx Level Patterning", Advanced Etch Technology for Nanopatterning VI Proceedings, vol. 10149, Apr. 2017, 11 pages.

* cited by examiner

*Primary Examiner* — Trang Q Tran
(74) *Attorney, Agent, or Firm* — Tutunjian & Bitetto, P.C.; Vazken Alexanian

(57) ABSTRACT

Methods and devices for forming multiple fin lengths includes forming a material stack on vertical fins. A plurality of mandrels are formed on the material stack. Spacers are formed along the plurality of mandrels with the spacers width being a length of short fins. One or more of the plurality of mandrels are removed. The material stack is patterned to form the short fins beneath the spacers and long fins. The vertical fins are cut with the pattern of the material stack to form the short fins and the long fins.

18 Claims, 14 Drawing Sheets

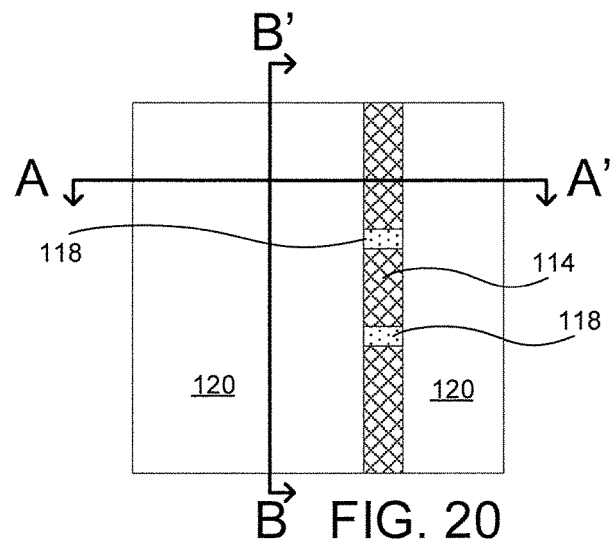
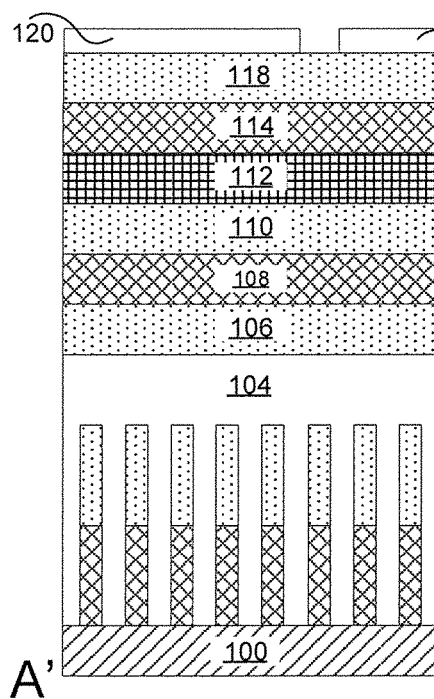
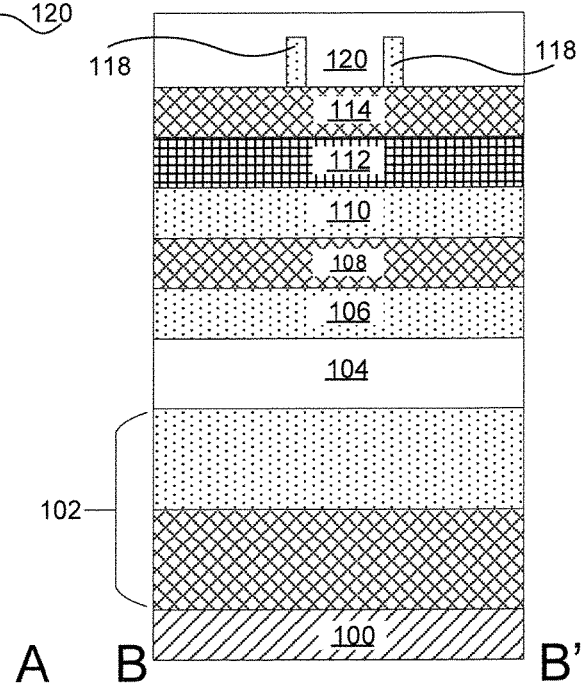
FIG. 20
FIG. 21
FIG. 22

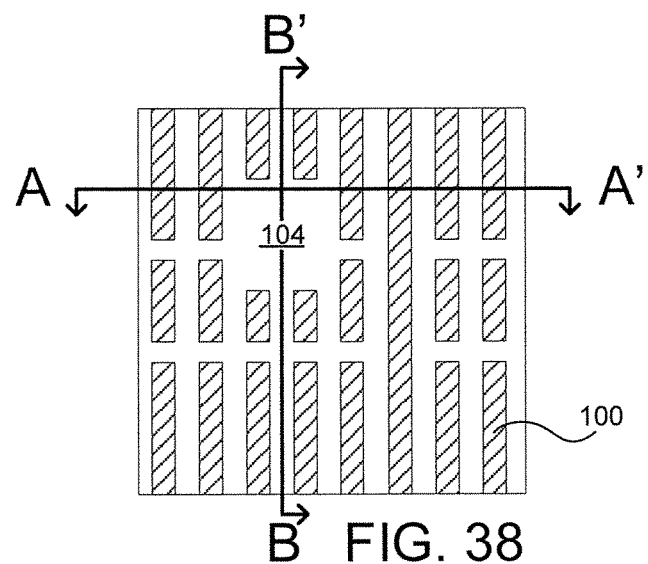
FIG. 38
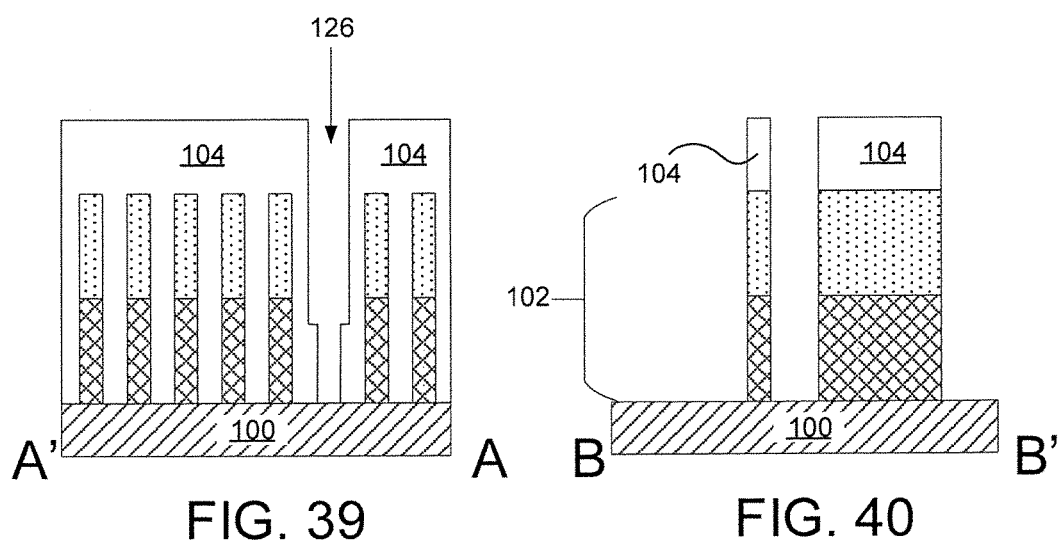
FIG. 39
FIG. 40

SELF-ALIGNED DOUBLE PATTERNING FORMED FINCUT

BACKGROUND

Technical Field

The present invention generally relates to cutting fins for a semiconductor device, and more particularly to devices and methods for cutting fins using self-aligned double patterning.

Description of the Related Art

Vertical transport field effect transistor (VTFET) fins can be cut using extreme ultra-violet (EUV) direct print to cut fins, but EUV direct print can produce variations in the fin length. These variations can be due to optical proximity correction (OPC) model variation, lithographic process variation, etch process variation, mask variation, and line edge roughness (LER). This variability of the fin length yields a device width with a variance outside tolerances.

SUMMARY

In accordance with an embodiment of the present invention, a method forming multiple fin lengths includes forming a material stack on vertical fins. The material stack includes a plurality of mask layers, a memorization layer, and a first cutting mask. A plurality of mandrels are formed on the material stack. The mandrels width being a part of a length of long fins. Spacers are formed along the plurality of mandrels. The spacers width being a length of short fins. A second cutting mask is deposited and patterned over one or more of the plurality of mandrels. One or more of the plurality of mandrels exposed through the second cutting mask are removed. The second cutting mask is removed. The material stack is patterned to form the short fins below the spacers and the long fins. The vertical fins are cut with the pattern of the material stack to form the short fins and the long fins.

In accordance with another embodiment of the present invention, a method forming multiple fin lengths includes forming a material stack on vertical fins. The material stack includes a plurality of mask layers, a plurality of memorization layers, and a first cutting mask. A plurality of mandrels are formed on the material stack. A first memorization layer is etched with a pattern formed by the plurality of mandrels. The plurality of mandrels are removed. Spacers are formed along the first memorization layer. The spacers width being a length of short fins. The first memorization layer is removed. A second cutting mask is deposited and patterned over one or more of the spacers. The second cutting masks width being a length of long fins. The material stack is patterned to form the short fins below the spacers and the long fins. The vertical fins are cut with the pattern of the material stack to form the short fins and the long fins. The material stack is removed.

In accordance with yet another embodiment of the present invention, a semiconductor device with multiple fin lengths. The device includes vertical transport field effect transistors formed including a first gate width in first fins in a first region and a second gate width in second fins in a second region. A bottom source/drain region formed in a substrate below the first and second fins. A gate structure formed about the first and second fins. A top source/drain region on the first and second fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 20 is a top view showing the material stack of FIG. 17 after having the first amorphous layer removed and a cutting mask deposited and patterned, in accordance with an embodiment of the present invention;

FIG. 21 is a cross-sectional view showing the material stack of FIG. 18 after having the first amorphous layer removed and a cutting mask deposited and patterned, in accordance with an embodiment of the present invention;

FIG. 22 is a cross-sectional view showing the material stack of FIG. 19 after having the first amorphous layer removed and a cutting mask deposited and patterned, in accordance with an embodiment of the present invention;

FIG. 38 is a top view showing the material stack of FIG. 35 after having exposed the removable fin hard mask, the third dielectric layer, and the fourth dielectric layer removed, in accordance with an embodiment of the present invention;

FIG. 39 is a cross-sectional view showing the material stack of FIG. 36 after having exposed the removable fin hard mask, the third dielectric layer, and the fourth dielectric layer removed, in accordance with an embodiment of the present invention;

FIG. 40 is a cross-sectional view showing the material stack of FIG. 37 after having exposed the removable fin hard mask, the third dielectric layer, and the fourth dielectric layer removed, in accordance with an embodiment of the present invention;

DETAILED DESCRIPTION

Figure 1:
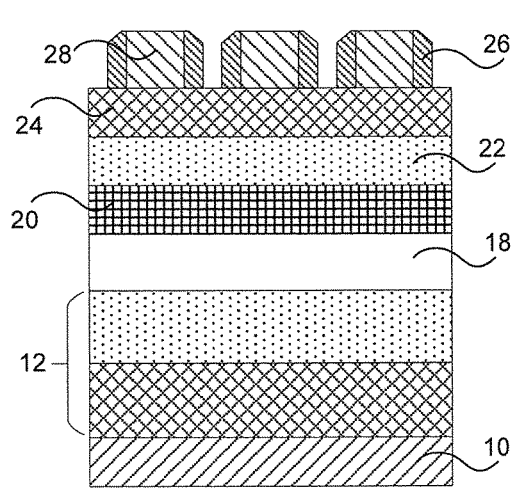
FIG. 1 is a cross-sectional view showing a semiconductor device having of a fin hard mask, mandrels, spacers, and a material stack for cutting fins for at least one embodiment of self-aligned double patterning process, in accordance with an embodiment of the present invention.

Vertical transport field effect transistors (VTFETs) with multiple fin lengths on the same chip are a challenge to manufacture. Vertical field effect transistors (VFETS) and VTFETS will be interchangeable hereinafter. Employing a self-aligned double patterning (SADP) process to cut the fins can save structure in shorter length fins where variation in structure can have a larger impact on the performance of the VTFET. The variation between fins utilizing the SADP process become better than existing direct print fin etching processes. For example, if the direct print can vary from about 1 to 10 nanometers between fin lengths, then the SADP process can vary by about 1 to 4 nanometers between fin lengths, e.g., 150% or better. In another example, the fin length has a variance improvement of greater than forty percent compared to lithographically defined fins for the same fin length. The SADP process also supports longer fin lengths for VTFETs on the same chip. A semi-conductor device with multiple fin lengths can be formed from the short fins and the long fins. The semi-conductor device can have vertical transport field effect transistors formed with a first gate width in first fins in a first region and a second gate width in second fins in a second region. In one example, the short fins can be the first fins and the long fins can be the second fins. A bottom source/drain region formed in a substrate below the first and second fins. A gate structure formed about the first and second fins with a top source/drain region on the first and second fins.

Multiple fin lengths can be provided in accordance with aspects of the present invention. In one useful embodiment, the shorter fin length can be defined by the SADP process. The shorter fin length can be defined as the width of the spacer employed in the SADP process. A longer Fin can be formed employing the SADP without the mandrel pull. The longer fin width would be defined by the width of two spacers and the mandrel not pulled from between the two spacers. In one example, a spacer of 20 nanometers (nm) and a mandrel of 25 nanometers (nm) would produce a shorter fin of 20 nanometers (nm) and a longer fin of 65 nanometers (nm).

In another useful embodiment, the shorter fin length can be defined by the SADP process. The shorter fin length can be defined as the width of the spacer employed in the SADP process. A longer Fin can be formed employing a fin cut mask over the spacer. The longer fin width would be defined by the width of the fin cut mask. In one example, a spacer of 20 nanometers (nm) and fin cut mask of 75 nanometers (nm) would produce a shorter fin of 20 nanometers (nm) and a longer fin of 75 nanometers (nm).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIG. 1t will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a fin hard mask, mandrels, spacers, and a material stack for cutting fins for at least one embodiment of self-aligned double patterning process, in accordance with an embodiment of the present invention. The material stack layers are selectively etchable regarding neighboring layers, so that a layer can be etched or removed without adversely affecting the layers above or below. The material stack includes a substrate 10. The substrate 10 can have multiple layers. A fin hard mask 12 can be on the substrate 10. The fin hard mask 12 can be a single material or a stack of materials. The single material can be a dielectric layer and the stack of materials can be a stack of dielectric layers. The dielectric layer(s) can include an oxide, for example, silicon oxide ($SiO_2$), a nitride, for example, a silicon nitride ($Si_3N_4$), or an oxynitride, for example, silicon oxynitride (SiON), SiOC, SiOCN, SiCN, SiBCN, or any suitable combination of those materials. The stack of dielectric layers can alternate between different materials, forming an alternating stack of dielectric layers. In one embodiment, the fin hard mask 12 includes three dielectric layers.

The material stack can include a cutting mask 18. The cutting mask 18 can be on the fin hard mask 12. In one example, the cutting mask 18 is an organic planarization layer (OPL). The material stack can include a memorization layer 20. The memorization layer 20 can be on the cutting mask 18. In one example, the memorization layer 20 can include amorphous silicon (aSi). Alternatively, the memorization layer 20 can include hydrogenated amorphous silicon (aSi:H), amorphous silicon carbon (aSiC), amorphous hydrogenated silicon carbon (aSiC:H) and combinations thereof including combinations with amorphous silicon (aSi). A mask stack can be on the memorization layer 20.

The stack of masks can include dielectric layers or any suitable materials. In one embodiment, the mask stack includes a first mask layer 24 and a second mask layer 22. The second mask layer 22 can be on the memorization layer 20. The second mask layer 22 can include an oxide. In one example, the second mask layer 22 can include silicon oxide ($SiO_2$). The first mask layer 24 can be on the second mask layer 22. The first mask layer 24 can include a nitride. In one example, the first mask layer 24 can include silicon nitride ($Si_3N_4$).

Mandrels 28 can be formed on the material stack utilizing a deposition process such as, for example, spin-on, chemical vapor deposition (CVD), plasma-enhanced chemical vapor deposition (PECVD), evaporation, chemical solution deposition and other like deposition techniques. The mandrels 28 can then be patterned. The mandrels 28 can include amorphous silicon (aSi) or any suitable material. Spacers 26 can be formed on the sides of the mandrels 28. The spacers 26 can be etched back to be the width of the smaller fins. The etching of the spacers 26 can be referred to as a spacer etch back (SEB) process. Examples of etching processes that can be used to provide the spacers 26 include any etching process such as, e.g., reactive ion etching (RIE). Etch chemistries for forming the spacers 26 are generally based on $CF_x$ species, such as $CH_3F$. The mandrels 28 and the spacers 26 can be the width of the larger fins. The spacers 26 can include an oxide (e.g., silicon oxide). The spacers 26 can include but are not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

Figure 2:
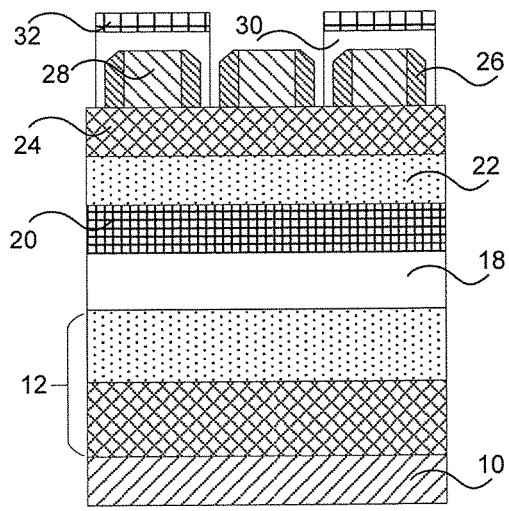
FIG. 2 is a cross-sectional view showing the material stack of FIG. 1 after having a block mask and a hard mask deposited and patterned, in accordance with an embodiment of the present invention.

Referring to FIG. 2, a block mask 30 and a hard mask 32 are deposited and patterned over the mandrels 28 and spacers 26. The block mask 30 can be formed utilizing a deposition process. The thickness of the block mask 30 can vary so long as its thickness is greater than the height of the mandrels 28 and spacers 26. In one example, the block mask 30 is an OPL. The block mask 30 is patterned to cover the mandrels 28 to be saved from the mandrel pull process. The hard mask 32 can include an oxide such as, e.g., silicon oxide or a nitride such as, e.g., silicon nitride, which is deposited on block mask 30. In one example, the hard mask 32 can include silicon-containing antireflective coating (SiArc). The hard mask 32 is patterned over the block mask 30.

Figure 3:
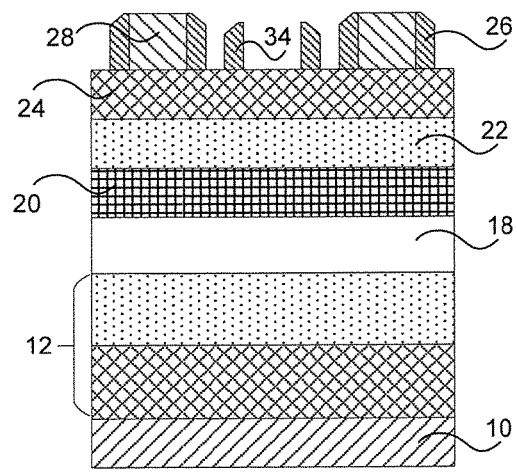
FIG. 3 is a cross-sectional view showing the material stack of FIG. 2 after having one of the mandrels, the block mask, and the hard mask removed, in accordance with an embodiment of the present invention.

Referring to FIG. 3, one of the mandrels 28, the block mask 30, and the hard mask 32 are removed. The one of the mandrels 28 is removed in a mandrel pull. Mandrel removal can cause erosion of the spacers 26 that are not protected by the block mask 30 and the hard mask 32. The erosion of the spacers 26 can form spacers 34, which are shorter than the spacers 26. The block mask 30 and hard mask 32 are removed after the one of the mandrels 28 is removed. The one of the mandrels 28, the block mask 30, and the hard mask 32 can be removed with an etch process. As used herein, an "anisotropic etch" denotes a material removal process in which the etch rate in the direction normal to the surface to be etched is greater than in the direction parallel to the surface to be etched. The anisotropic etch may include RIE. Other examples of anisotropic etching that can be used at this point of the present invention include ion beam etching, plasma etching or laser ablation. Some examples of etch chemistries may include a $CF_x$ based etch for etching material layers that are silicon containing antireflective coatings (SiArc) layers. The block mask 30 may be etched using a etch chemistry of $N_2/H_2$ and/or HBr/He and/or $CO/CO_2$ and/or $CO/SO_2$. The mandrel 28 can be etched using an etch chemistry composed of $Cl_2/Ar/CH_4$ and/or $HBr/O_2$.

Figure 4:
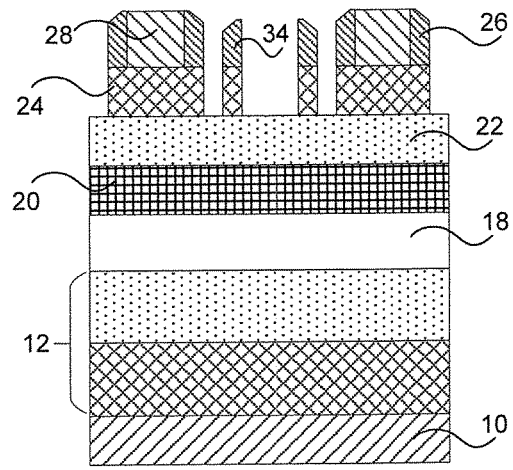
FIG. 4 is a cross-sectional view showing the material stack of FIG. 3 after having a first dielectric layer of the material stack etched, in accordance with an embodiment of the present invention.

Referring to FIG. 4, a first mask layer 24 of the material stack is etched. The first mask layer 24 can be etched using an anisotropic etch following a pattern of the remaining mandrels 28, the spacers 26, and the spacers 34. Examples of etching that can be include any etching process such as, e.g., RIE. Etch chemistries can be selective to the material in the first mask layer 24 and can be based on $CF_x$ species, such as $CH_3F$. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1.

Figure 5:
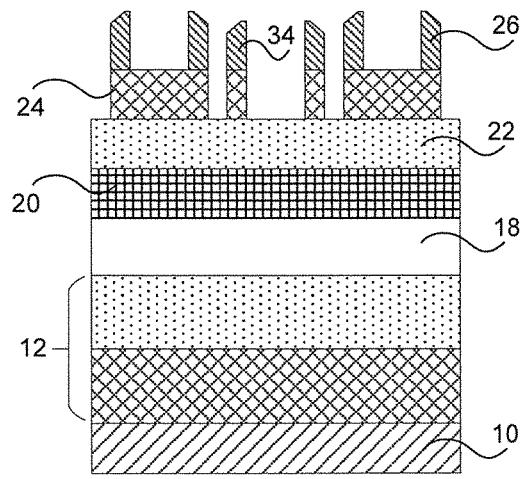
FIG. 5 is a cross-sectional view showing the material stack of FIG. 4 after having the remaining mandrels removed, in accordance with an embodiment of the present invention.

Referring to FIG. 5, the remaining mandrels 28 are removed. The remaining mandrels 28 can be removed with a selective etch process. The selective etch process can use an etch chemistry $Cl_2/Ar/CH_4$ and/or $HBr/O_2$ or any suitable combination.

Figure 6:
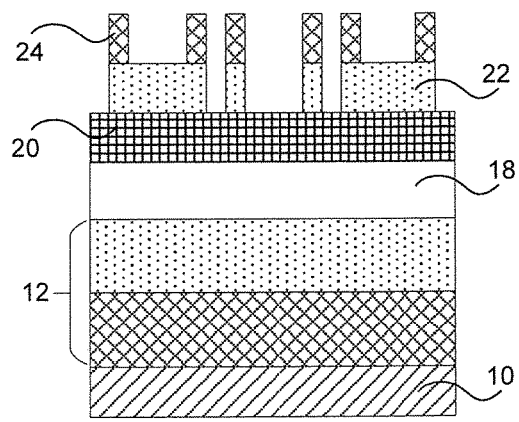
FIG. 6 is a cross-sectional view showing the material stack of FIG. 5 after having the spacers removed, the first dielectric layer of the material stack etched further, and a second dielectric layer of the material stack etched, in accordance with an embodiment of the present invention.

Referring to FIG. 6, the spacers 26 and the spacers 34 are removed, the first mask layer 24 is etched further, and the second mask layer 22 is etched. The spacers 26 and the spacers 34 can be removed with a selective etch. The selective etch can further etch the first mask layer 24 and etch the second mask layer 22. The selective etch can use an etch chemistry of $C_4F_8/Ar$, or other suitable combination. Alternatively, the spacers 26, the spacers 34, the first mask layer 24, and the second mask layer 22 can be etched with separate etching processes.

Figure 7:
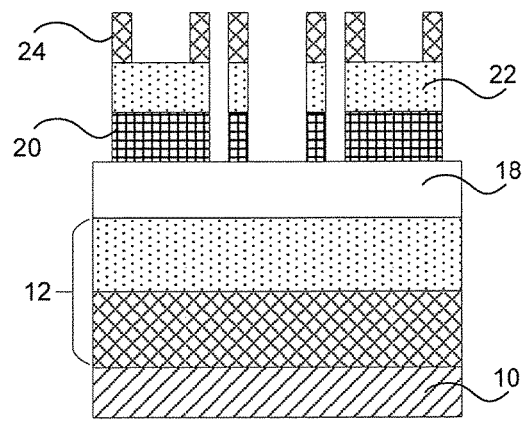
FIG. 7 is a cross-sectional view showing the material stack of FIG. 6 after having a memorization layer of the material stack etched, in accordance with an embodiment of the present invention.

Referring to FIG. 7, the memorization layer 20 is etched. The memorization layer 20 can be etched with a selective etch process. The selective etch process can use an etch chemistry of $Cl_2$ less $SF_6$, and/or $Cl_2/Ar/CH_4$ and/or $HBr/O_2$ and/or HBr/He or any suitable combinations. Additional masks (not shown) can be applied to form extra fin extensions for longer fins. Fin lengths that are not nominal can be formed through additional spacer depositions.

Figure 8:
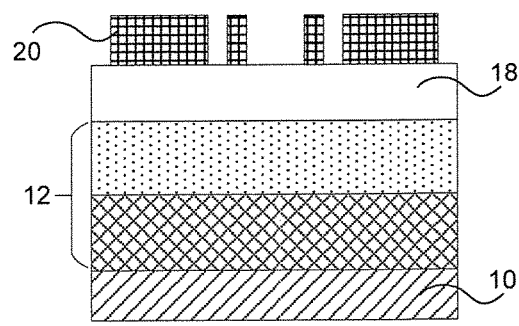
FIG. 8 is a cross-sectional view showing the material stack of FIG. 7 after having the first dielectric layer and the second dielectric layer of the material stack removed, in accordance with an embodiment of the present invention.

Referring to FIG. 8, the first mask layer 24 and the second mask layer 22 are removed. The first mask layer 24 and the second mask layer 22 can be removed with a selective etch. The selective etch can use an etch chemistry of udHF and/or $CH_3F$ and/or BHF and/or $C_4F_8$, or other suitable combinations. Alternatively, the first mask layer 24 and the second mask layer 22 can be etched with separate etching processes.

Figure 9:
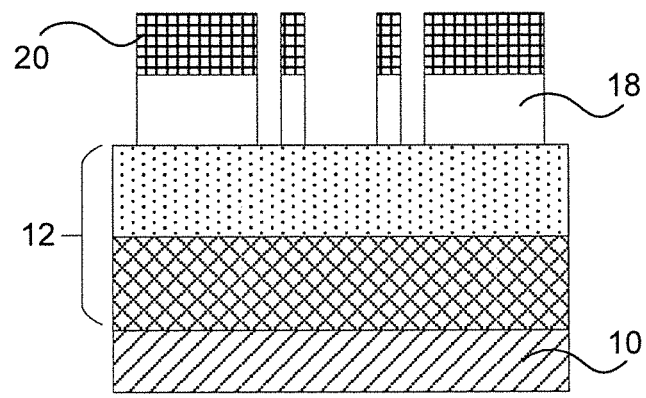
FIG. 9 is a cross-sectional view showing the material stack of FIG. 8 after having a cutting mask of the material stack patterned, in accordance with an embodiment of the present invention.

Referring to FIG. 9, the cutting mask 18 is patterned. In one example, the cutting mask 18 is an OPL. The cutting mask 18 can be patterned using an etch process with the memorization layer 20 as the pattern. The etch process utilized on the cutting mask 18 can be a anisotropic etch process, including RIE. Organic planarization layers (OPLs) may be etched using a etch chemistry of $N_2/H_2$ and/or HBr/He and/or $CO/CO_2$ and/or $CO/SO_2$.

Figure 10:
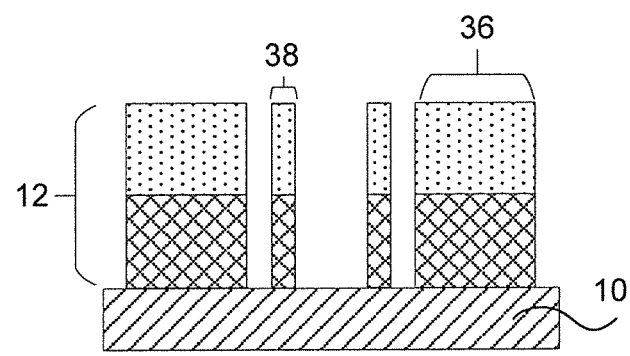
FIG. 10 is a cross-sectional view showing the material stack of FIG. 9 after having a third dielectric layer, a fourth dielectric layer, and a fifth dielectric layer of the material stack etched and the amorphous layer and cutting mask removed, in accordance with an embodiment of the present invention.

Referring to FIG. 10, the fin hard mask 12 of the material stack is etched, and the memorization layer 20 and the cutting mask 18 are removed. The fin hard mask 12 can be etched using an anisotropic etch following the pattern of the memorization layer 20 and the cutting mask 18. Examples of etching can include any etching process such as, e.g., RIE. Etch chemistries can be selective to the material in the fin hard mask 12 and can be based on $CF_x$ species, such as $CH_3F$. The memorization layer 20 can be removed during the anisotropic etch process for etching the fin hard mask 12. Alternatively, the memorization layer 20 can be removed with another selective etch process. The cutting mask 18 can be removed with a selective etch process. The fin hard mask 12 can be etched to form long fins 36 and short fins 38. In on embodiment, the short fins 38 can have a width equal of the spacers 26 and the long fins 36 can have a width equal to two spacers 26 and a mandrel 28.

Figure 11:
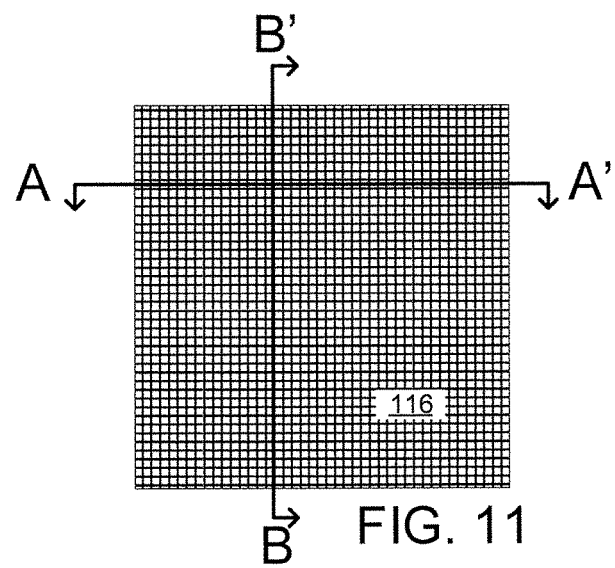
FIG. 11 is a top view of a material stack for cutting fins for at least one embodiment of self-aligned double patterning process, in accordance with an embodiment of the present invention.

In another embodiment, referring to FIG. 11, a top view of a material stack for cutting fins with a self-aligned double patterning process. The material stack layers are selectively etchable regarding neighboring layers, so that a layer can be etched or removed without adversely affecting the layers above or below. The material stack includes a first memorization layer 116. In one example, the first memorization layer 116 can include amorphous silicon (aSi). Alternatively, the first memorization layer 116 can include hydrogenated amorphous silicon (aSi:H), amorphous silicon carbon (aSiC), amorphous hydrogenated silicon carbon (aSiC:H) and combinations thereof including combinations with amorphous silicon (aSi). The thickness of the first memorization layer 116 can vary. In one example, the first memorization layer 116 can have a thickness of about, e.g., 60 nanometers (nm).

Figure 12:
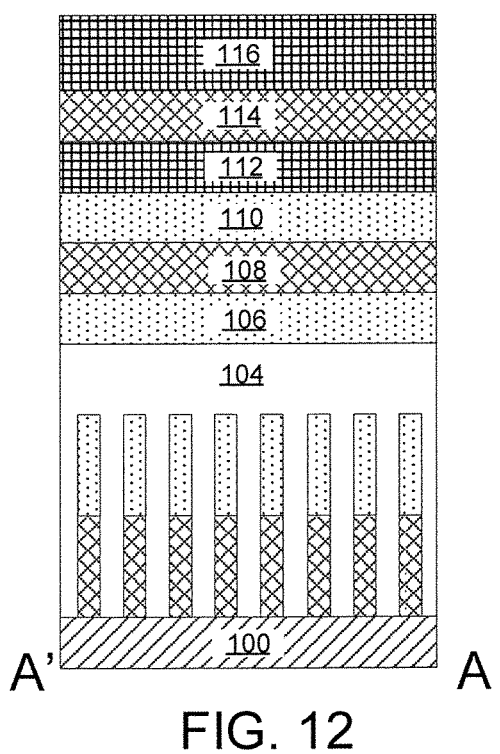
FIG. 12 is a cross-sectional view showing the material stack for cutting fins for at least one embodiment of self-aligned double patterning process, in accordance with an embodiment of the present invention.

Referring to FIG. 12, a cross-sectional view of the material stack is shown. The material stack can include a substrate 100. The substrate 100 can include multiple layers formed thereon. The substrate 100 can include any suitable substrate structure, e.g., a bulk semiconductor, a semiconductor-on-insulator (SOI) substrate, etc. In one example, the substrate 100 can include a silicon-containing material. Illustrative examples of Si-containing materials suitable for the substrate 100 can include, but are not limited to, Si, SiGe, SiGeC, SiC and/or multi-layers thereof. Although silicon is the predominantly used semiconductor material in wafer fabrication, alternative semiconductor materials can be employed as well, such as, but not limited to, germanium, gallium arsenide, gallium nitride, silicon germanium, cadmium telluride, zinc selenide, etc. In other embodiments, the substrate 100 can include multiple layers of the same or different semiconductor materials.

The material stack can include multiple fin hard masks on the substrate 100. The fin hard masks can include a single material or combination of materials. In one example, the fins include an alternating stack of dielectric layers. The dielectric layers can each include an oxide, for example, silicon oxide ($SiO_2$), a nitride, for example, a silicon nitride ($Si_3N_4$), or an oxynitride, for example, silicon oxynitride (SiON), SiOC, SiOCN, SiCN, SiBCN, or any suitable combination of those materials. A cutting mask 104 can be covering the fin hard masks on the substrate 100. The thickness of the cutting mask 104 can vary so long as its thickness is greater than the height of the fin hard masks. In one example, the cutting mask 104 can be an OPL.

The material stack can include a mask stack on the cutting mask 104. The mask stack can include dielectric layers. The dielectric layers can include a combination of materials. The dielectric layers can include an alternating stack of dielectric layers. In one example, the mask stack can include a fourth mask layer 106, a third mask layer 108, and a second mask layer 110. In one example, the fourth mask layer 106 can be on the cutting mask 104 and include an oxide. The thickness of the fourth mask layer 106 can vary. In one example, the thickness of the fourth dielectric layer can be about, e.g., 30 nanometers (nm). In one example, the third mask layer 108 can be on the fourth mask layer 106 and include a nitride. The thickness of the third mask layer 108 can vary. In one example, the thickness of the third mask layer 108 can be about, e.g., 30 nanometers (nm). In one example, the second mask layer 110 can be on the third mask layer 108 and include an oxide. The thickness of the second mask layer 110 can vary. In one example, the thickness of the fourth dielectric layer can be about, e.g., 30 nanometers (nm).

The material stack can include a second memorization layer 112 on the mask stack. In one example, the second memorization layer 112 can include amorphous silicon (aSi). The thickness of the first memorization layer 116 can vary. In one example, the second memorization layer 112 has a thickness of about, e.g., 30 nanometers (nm). A first mask layer 114 can be on the second memorization layer 112. The first mask layer 114 can include a dielectric layer. In one example, the first mask layer 114 can include a nitride. The thickness of the first mask layer 114 can vary. In one example, the thickness of the first mask layer 114 can be about, e.g., 30 nanometers (nm). The first memorization layer 116 can be on the first mask layer 114.

Figure 13:
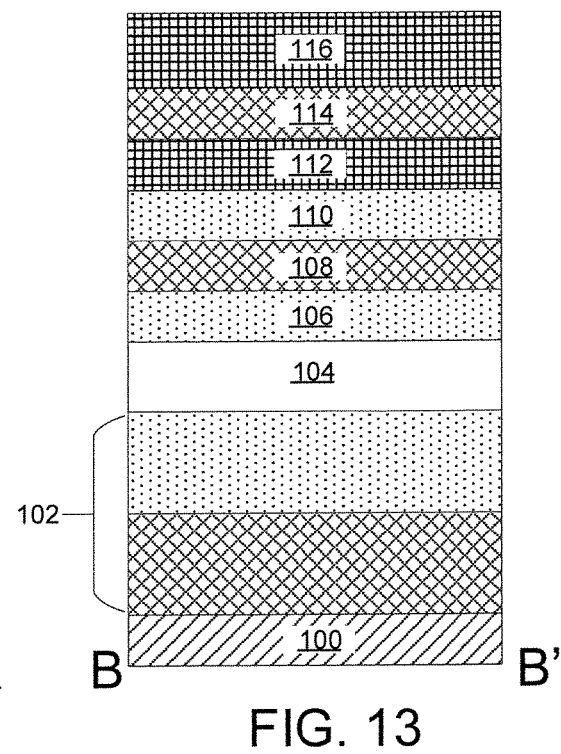
FIG. 13 is a cross-sectional view showing the material stack for cutting fins for at least one embodiment of self-aligned double patterning process, in accordance with an embodiment of the present invention.

Referring to FIG. 13, a cross-sectional view of the material stack is shown. The material stack can include fin hard masks 102 on the substrate 100. The fin hard masks 102 can include a single material or a combination of materials. The fin hard masks 102 can include a dielectric stack. The dielectric stack can include a combination of materials. The dielectric stack can include an alternating stack of dielectric layers. In one example, the dielectric stack includes alternating layers of oxides and nitrides.

Figure 14:
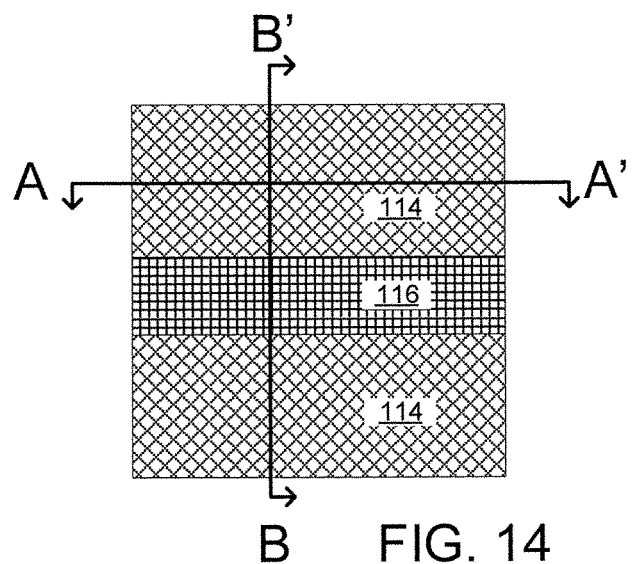
FIG. 14 is a top view showing the material stack of FIG. 11 after having a first amorphous layer etched with a mandrel pattern, in accordance with an embodiment of the present invention.

Referring to FIG. 14, the first memorization layer 116 is etched with a mandrel pattern. A mandrel mask (not shown) is deposited and patterned on the first memorization layer 116. The mandrel mask can include a dielectric material. The first memorization layer 116 is patterned and etched to form a mandrel. The first memorization layer 116 can be etched with an anisotropic etch. The first memorization layer 116 can be etched using an etch chemistry composed of $Cl_2/Ar/CH_4$.

Figures 15, 16:
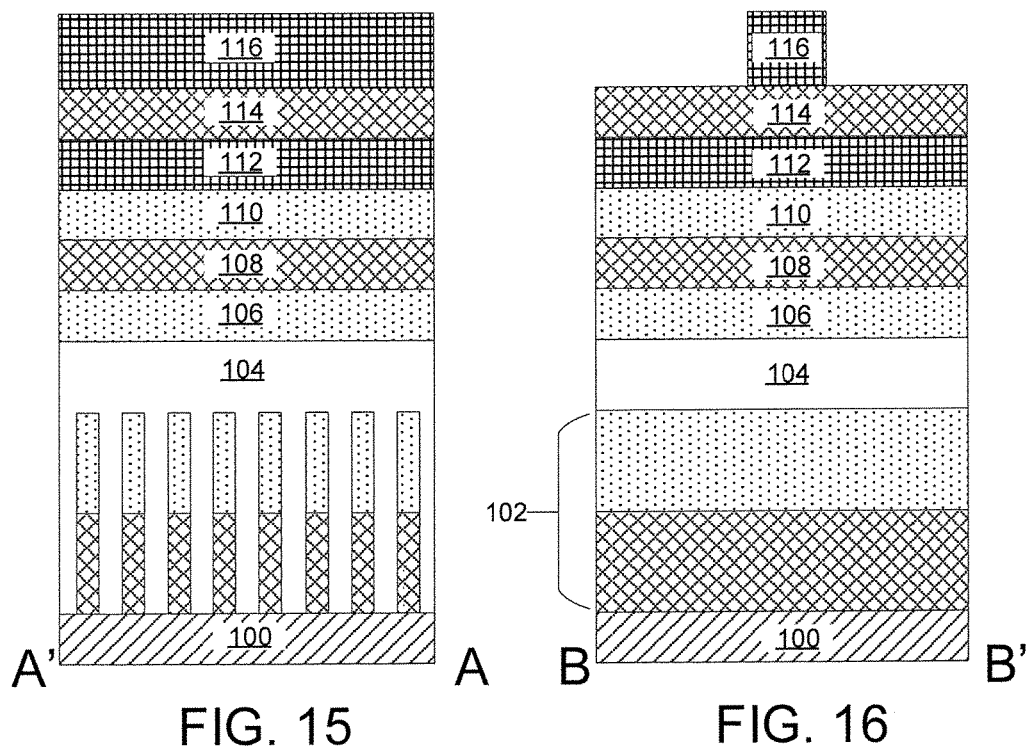
FIG. 15 is a cross-sectional view showing the material stack of FIG. 12 after having the first amorphous layer etched with the mandrel pattern, in accordance with an embodiment of the present invention.
FIG. 16 is a cross-sectional view showing the material stack of FIG. 13 after having the first amorphous layer etched with the mandrel pattern, in accordance with an embodiment of the present invention.

Referring to FIG. 15, a cross-sectional view after the first memorization layer 116 is etched with a mandrel pattern. This view shows that the material stack is unchanged as all the layers of the material stack can be viewed.

Referring to FIG. 16, a cross-sectional view after the first memorization layer 116 is etched with a mandrel pattern. This view shows that the first memorization layer 116 was etched and patterned after the mandrel mask. The first memorization layer 116 is now seen to only cover a portion of the material stack.

Figure 17:
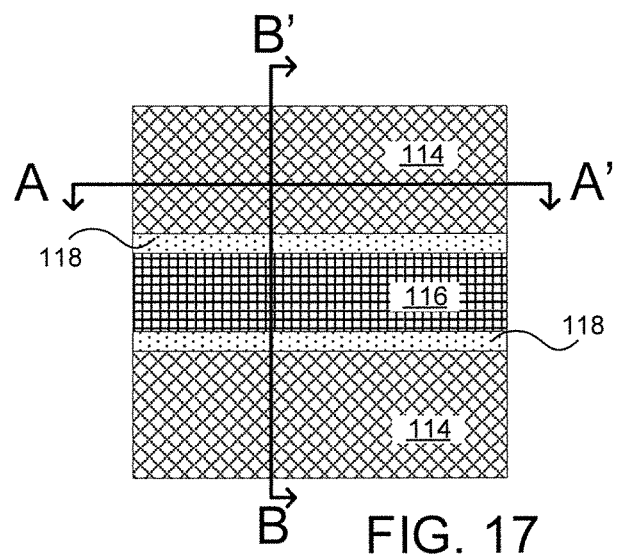
FIG. 17 is a top view showing the material stack of FIG. 14 after having spacers deposited and etched back, in accordance with an embodiment of the present invention.

Referring to FIG. 17, spacers 118 are deposited and etched back. The spacers 118 can include a dielectric material. The spacers 118 can be formed using a conformal deposition process over the first memorization layer 116 and the first mask layer 114. The term "conformal" denotes a layer having a thickness that does not deviate from greater than or less than 30% of an average value for the thickness of the layer. A conformal deposition process provides a conformal layer. The conformal layer can be deposited to a thickness equal to the width of the smaller fins. Examples of conformal deposition processes that can be used in providing the dielectric spacer material include, but are not limited to, chemical vapor deposition (CVD), plasma enhanced chemical vapor deposition (PECVD), or atomic layer deposition (ALD). The etching of the spacers 118 can be referred to as a spacer etch back (SEB) process. Examples of etching that used in providing the spacers 118 include any etching process such as, e.g., reactive ion etching (RIE). Etch chemistries for forming the spacers 118 are generally based on $CF_x$ species, such as $CH_3F$. The spacers 118 can be on the sides of the first memorization layer 116 after the SEB process. The spacers 118 can be etched back to be the width of the smaller fins.

Figure 18:
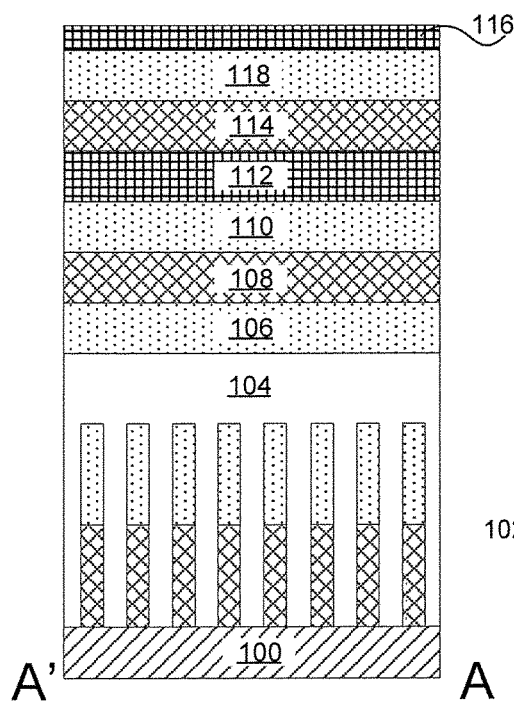
FIG. 18 is a cross-sectional view showing the material stack of FIG. 15 after having the spacers deposited and etched back, in accordance with an embodiment of the present invention.

Referring to FIG. 18, a cross-sectional view after the spacers 118 were deposited and etched back. This view shows the spacers 118 are shorter than the first memorization layer 116.

Figure 19:
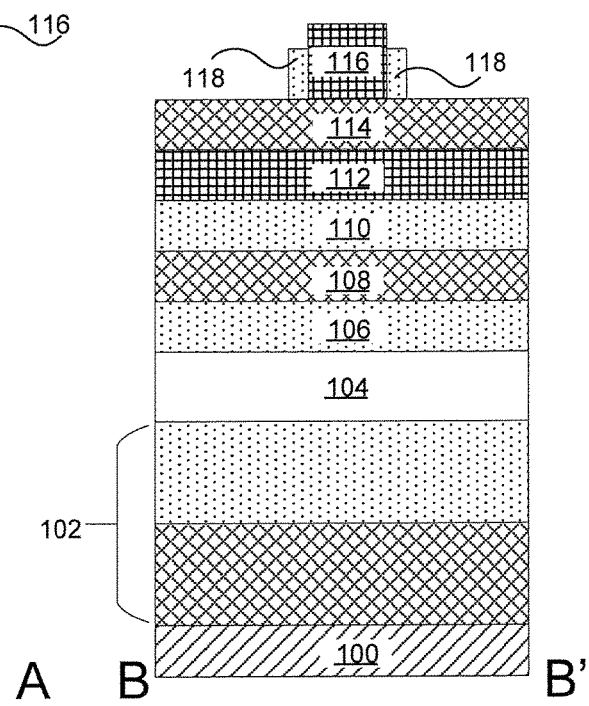
FIG. 19 is a cross-sectional view showing the material stack of FIG. 16 after having the spacers deposited and etched back, in accordance with an embodiment of the present invention.

Referring to FIG. 19, a cross-sectional view after the spacers 118 are deposited and etched back. This view shows that the spacers 118 can be formed on the first mask layer 114 adjacent to the first memorization layer 116. The width of the spacers 118 can be the length of the smaller fin.

Referring to FIG. 20, the first memorization layer 116 is removed and a cutting mask 120 is deposited and patterned. The first memorization layer 116 can be removed. The first memorization layer 116 can be removed with a selective etch process. The first memorization layer 116 can be etched using an etch chemistry composed of $Cl_2/Ar/CH_4$. The cutting mask 120 can be deposited over the spacers 118 and the first mask layer 114. The cutting mask 120 can be formed utilizing a deposition process such as, for example, spin-on, CVD, PECVD, evaporation, chemical solution deposition and other like deposition techniques. The thickness of the cutting mask 120 can vary so long as its thickness is greater than the height of the spacers 118. In one example, the cutting mask 120 can be an OPL. The cutting mask 120 can be patterned to be open over a fin that will be removed later in the process.

Referring to FIG. 21, a cross-sectional view after the amorphous layer 116 is removed and the cutting mask 120 is deposited and patterned. This view shows the spacers 118 are shorter than the cutting mask 120 and the cutting mask has an opening over a removable fin hard mask to be removed later in the process.

Referring to FIG. 22, a cross-sectional view after the amorphous layer 116 is removed and the cutting mask 120 is deposited and patterned. This view shows that the spacers 118 can be covered with the cutting mask 120.

Figure 23:
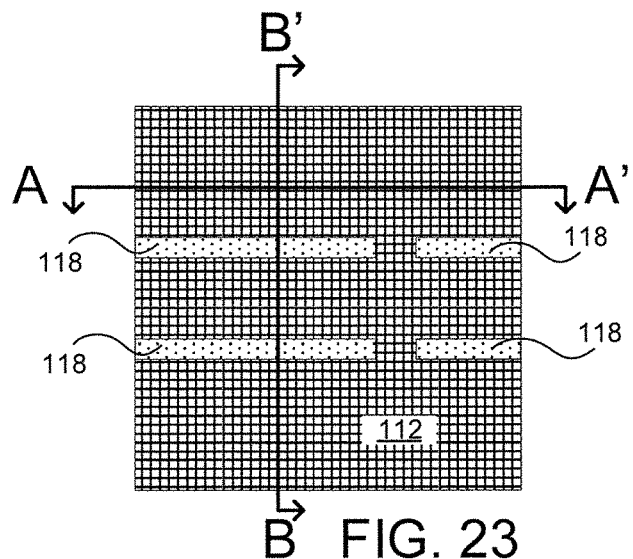
FIG. 23 is a top view showing the material stack of FIG. 20 after having the spacers etched and the cutting mask and a first dielectric layer removed, in accordance with an embodiment of the present invention.

Referring to FIG. 23, the spacers 118 are etched and the cutting mask 120 and first mask layer 114 are removed. The spacers 118 can be etched to remove a spacer not covered by the cutting mask 120. An anisotropic etch can be used to leave the spacers 118 covered by the cutting mask 120 intact after the etching process. Examples of etching that can be used on the spacers 118 include any anisotropic etching process such as, e.g., RIE. Etch chemistries for etching the spacers 118 are generally based on $CF_x$ species, such as $CH_3F$. The cutting mask 120 is removed. The cutting mask 120 can be removed with a selective etch process. In one example, OPLs may be etched using an etch chemistry of $N_2/H_2$ and/or HBr/He and/or $CO/CO_2$ and/or $CO/SO_2$. The first mask layer 114 is removed. The first mask layer 114 can be removed with an anisotropic etch process. The anisotropic etch process is employed to protect the first mask layer 114 under the spacers 118 while removing the exposed dielectric layer 114. Etch chemistries for removing the first mask layer 114 can be generally based on $CF_x$ species, such as $CH_3F$. The removal of the first mask layer 114 exposes the second memorization layer 112.

Figures 24, 25:
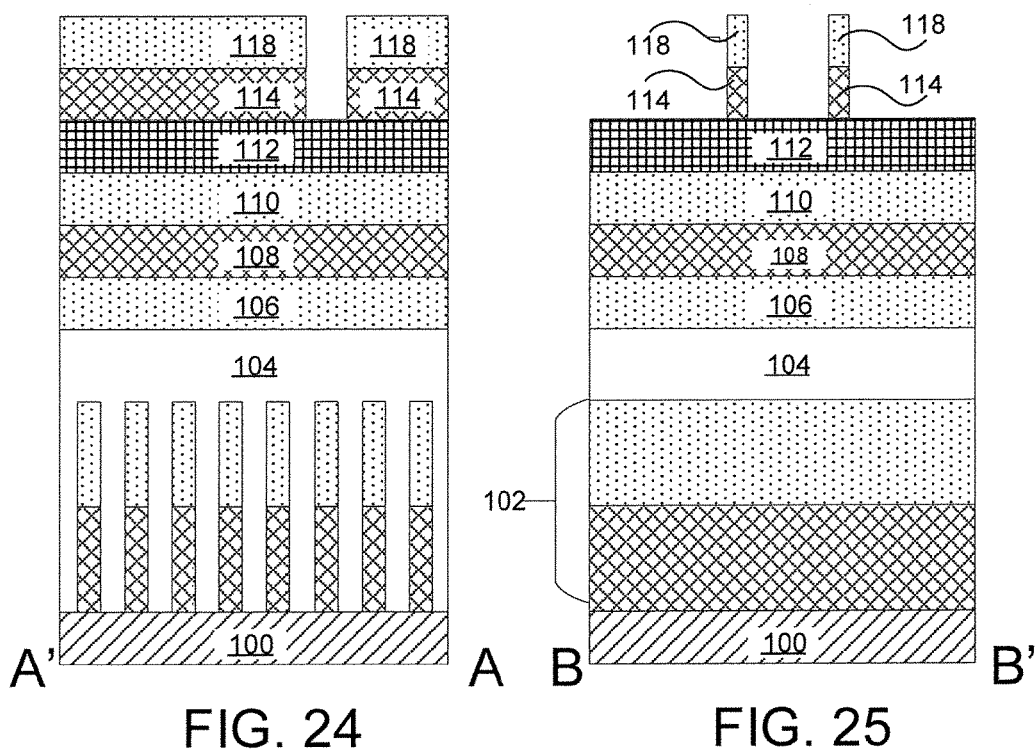
FIG. 24 is a cross-sectional view showing the material stack of FIG. 21 after having the spacers etched and the cutting mask and the first dielectric layer removed, in accordance with an embodiment of the present invention.
FIG. 25 is a cross-sectional view showing the material stack of FIG. 22 after having the spacers etched and the cutting mask and the first dielectric layer removed, in accordance with an embodiment of the present invention.

Referring to FIG. 24, a cross-sectional view after the spacers 118 are etched and the cutting mask 120 and first mask layer 114 are removed. This view shows an opening in the spacers 118 and the first mask layer 114 over the removable fin hard mask to be removed later in the process.

Referring to FIG. 25, a cross-sectional view after the spacers 118 are etched and the cutting mask 120 and first mask layer 114 are removed. This view shows that the remainder of the first mask layer 114 is the width of the spacers 118.

Figure 26:
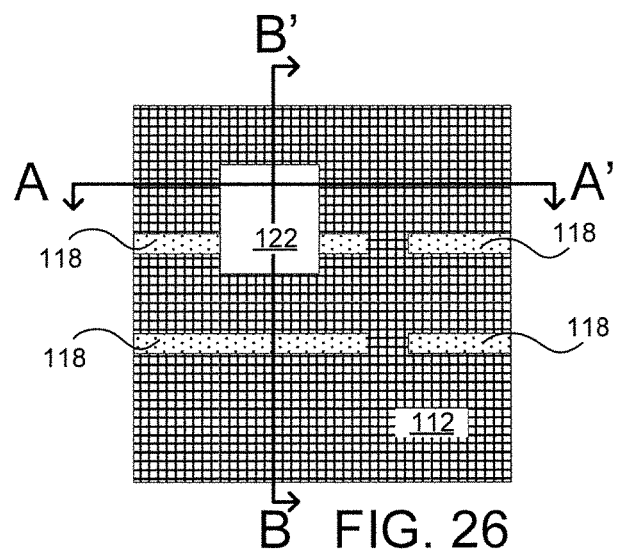
FIG. 26 is a top view showing the material stack of FIG. 23 after having a cutting mask deposited and patterned, in accordance with an embodiment of the present invention.

Referring to FIG. 26, a cutting mask 122 is deposited and patterned. The cutting mask 122 is deposited over the spacers 118 and the second memorization layer 112. The cutting mask 122 can be formed utilizing a deposition process such as, for example, spin-on, CVD, PECVD, evaporation, chemical solution deposition and other like deposition techniques. The thickness of the cutting mask 122 can vary so long as its thickness is greater than the height of the spacers 118 and the first mask layer 114. In one example, the cutting mask 122 can be an OPL. The cutting mask 122 can be patterned to have the width equal to the larger fin length. The cutting mask 122 can be patterned to have the width equal to cover one or more fins to produce multiple larger length fins. The cutting mask 122 can be patterned with an anisotropic etch process. In one example, OPLs may be etched using an etch chemistry of $N_2/H_2$ and/or HBr/He and/or $CO/CO_2$ and/or $CO/SO_2$.

Figures 27, 28:
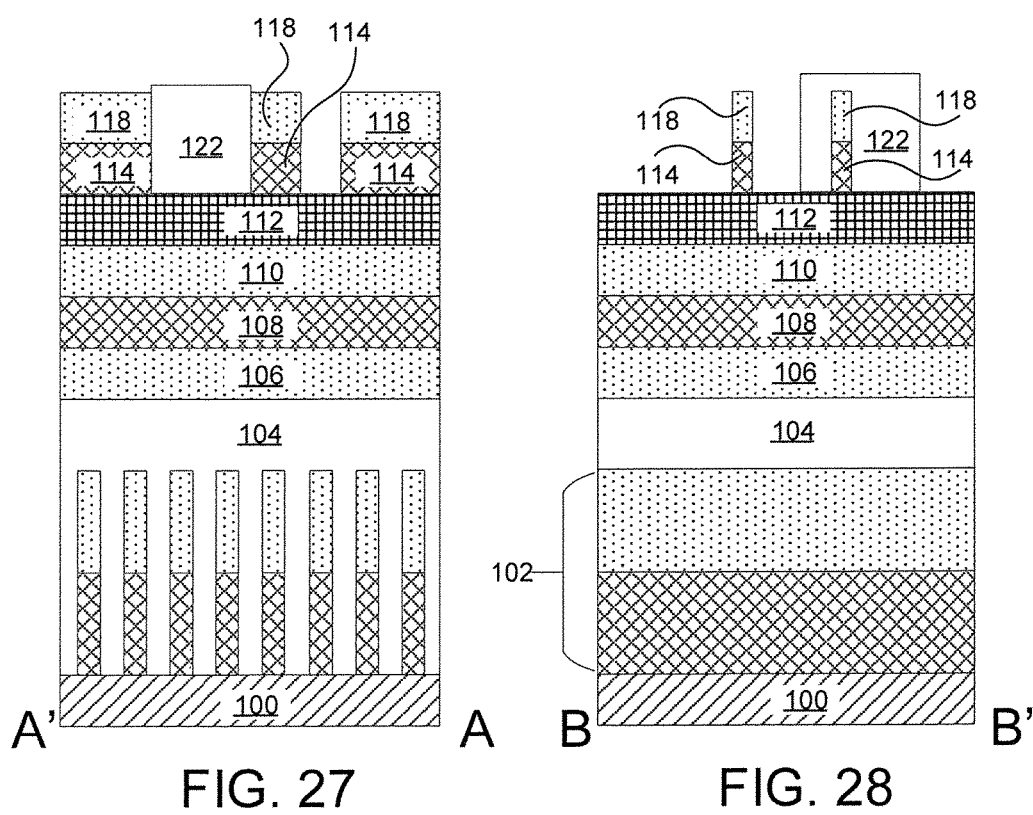
FIG. 27 is a cross-sectional view showing the material stack of FIG. 24 after having the cutting mask deposited and patterned, in accordance with an embodiment of the present invention.
FIG. 28 is a cross-sectional view showing the material stack of FIG. 25 after having the cutting mask deposited and patterned, in accordance with an embodiment of the present invention.

Referring to FIG. 27, a cross-sectional view after the cutting mask 122 is deposited and patterned. This view shows the cutting mask 122 has a height greater than the spacers 118 and the first mask layer 114. This view shows that the cutting mask 122 can be over one or more fin hard masks.

Referring to FIG. 28, a cross-sectional view after the cutting mask 122 is deposited and patterned. This view shows the cutting mask surrounding the spacers 118 and first mask layer 114. The width of the cutting mask 122 can be the length of the larger fin at the end of the process.

Figure 29:
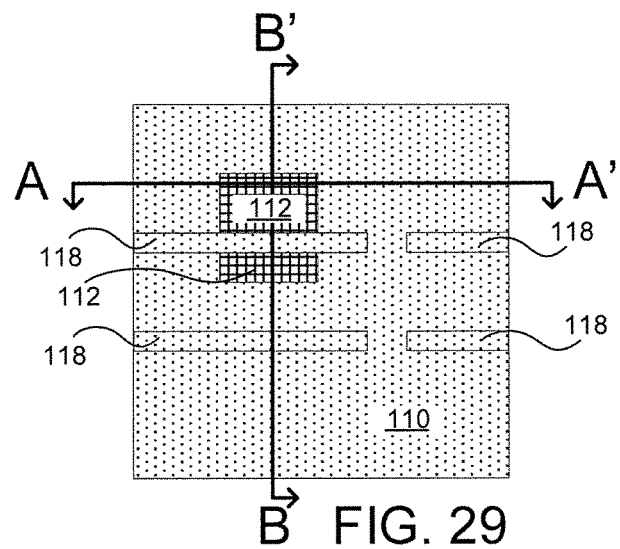
FIG. 29 is a top view showing the material stack of FIG. 26 after having a second amorphous layer etched and the cutting mask removed, in accordance with an embodiment of the present invention.

Referring to FIG. 29, the second memorization layer 112 is etched and the cutting mask 122 is removed. The second memorization layer 112 can be etched with an anisotropic etch process utilizing the spacers 118 and the cutting mask 122 as a pattern. The second memorization layer 112 can be etched using an etch chemistry composed of $Cl_2/Ar/CH_4$. The anisotropic etch process and removal of the second memorization layer 112 exposes the second mask layer 110. The cutting mask 122 can be removed with a selective etch process. In one example, OPLs may be etched using an etch chemistry of $N_2/H_2$ and/or HBr/He and/or $CO/CO_2$ and/or $CO/SO_2$. The top view of the material stack shows two different dielectric layers, both the spacers 118 and the second mask layer 110, are exposed along with the second memorization layer 112.

Figure 30:
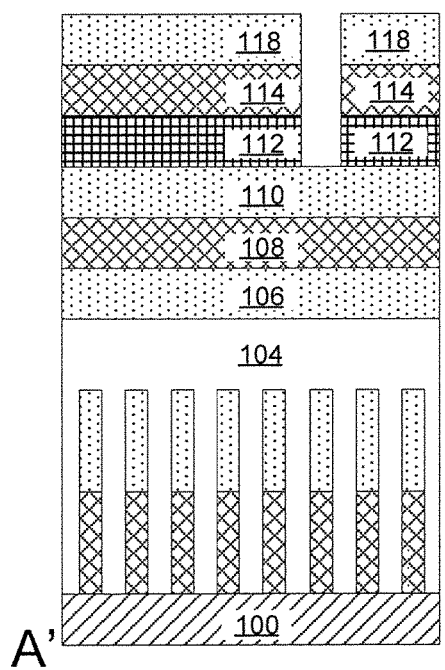
FIG. 30 is a cross-sectional view showing the material stack of FIG. 27 after having the second amorphous layer etched and the cutting mask removed, in accordance with an embodiment of the present invention.

Referring to FIG. 30, a cross-sectional view after the second memorization layer 112 is etched and the cutting mask 122 is removed. This view shows an opening in the spacers 118, the first mask layer 114, and the second memorization layer 112 over a fin to be removed later in the process. This view also shows the second mask layer 110 exposed at the bottom of the opening.

Figure 31:
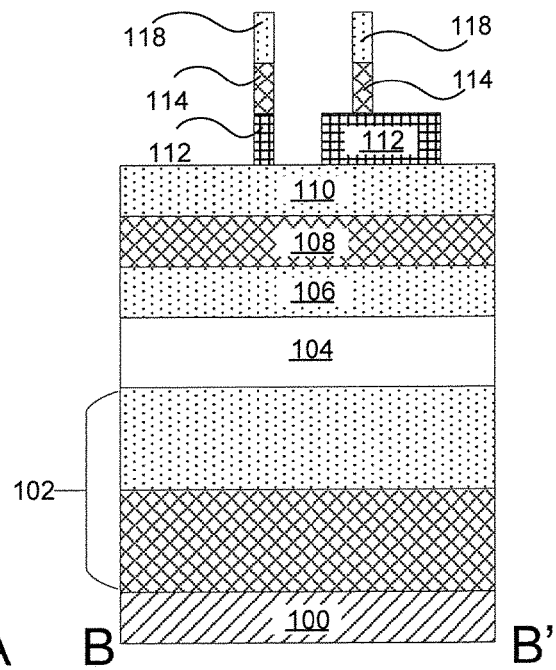
FIG. 31 is a cross-sectional view showing the material stack of FIG. 28 after having the second amorphous layer etched and the cutting mask removed, in accordance with an embodiment of the present invention.

Referring to FIG. 31, a cross-sectional view after the second memorization layer 112 is etched and the cutting mask 122 is removed. This view shows that the remainder of the second memorization layer 112 has two widths. A first width like the width of the spacers 118 and the second width like the width of the cutting mask 122 that was removed. The second width of the second memorization layer 112 can be the length of the larger fin at the end of the process.

Figure 32:
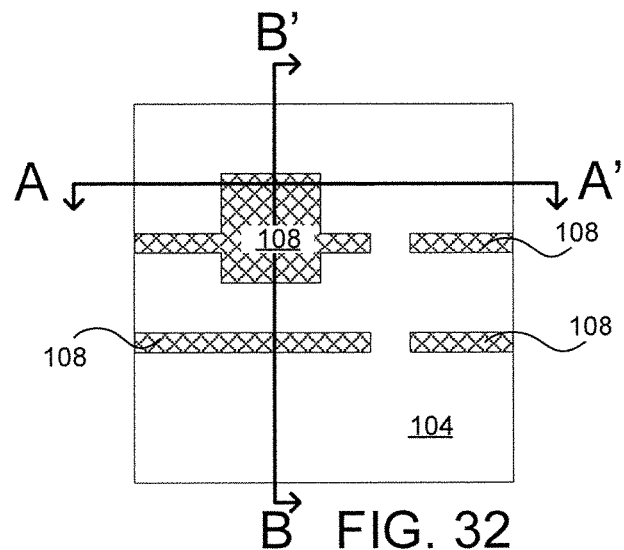
FIG. 32 is a top view showing the material stack of FIG. 29 after having a third dielectric layer and a fourth dielectric layer etched and the spacers, the second amorphous layer, the first dielectric layer, and the second dielectric layers removed, in accordance with an embodiment of the present invention.

Referring to FIG. 32, the third mask layer 108 and the fourth mask layer 106 are etched and the spacers 118, the first mask layer 114, the second memorization layer 112, and the second mask layer 110 are removed. The spacers 118 and the first mask layer 114 can be removed with an anisotropic etch process. Etch chemistries for removing the spacers 118 and the first mask layer 114 can be generally based on $CF_x$ species, such as $CH_3F$. The anisotropic etch process removes the spacers 118 and the first mask layer 114. The anisotropic etch process also removes the second mask layer 110 exposed from FIG. 29 and the third mask layer 108 under the second mask layer 110 exposed from FIG. 29 to expose portions of the fourth mask layer 106. The second memorization layer 112 can be removed with a selective etch process to expose the second mask layer 110. The second memorization layer 112 can be removed using an etch chemistry composed of $Cl_2/Ar/CH_4$. The second mask layer 110 can be removed with an anisotropic etch process. Etch chemistries for removing the second mask layer 110 can be generally based on $CF_x$ species, such as $CH_3F$. The anisotropic etch process removes the second mask layer 110 and any portions of the fourth mask layer 106 exposed previously. The third mask layer 108 is exposed wherever the second mask layer 110 was removed. The cutting mask 104 is exposed with the removal of portions of the forth dielectric layer 106. The exposed cutting mask 104 is over a removable fin hard mask to be removed later in the process.

Figure 33:
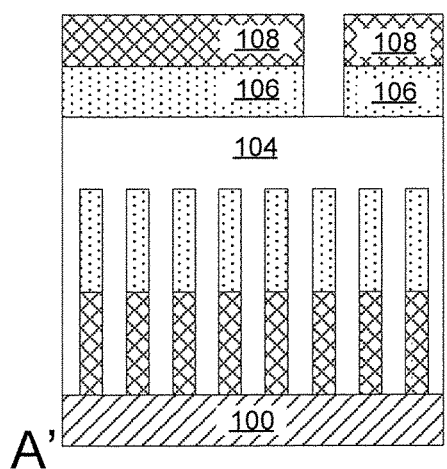
FIG. 33 is a cross-sectional view showing the material stack of FIG. 30 after having the third dielectric layer and the fourth dielectric layer etched and the spacers, the second amorphous layer, the first dielectric layer, and the second dielectric layer removed, in accordance with an embodiment of the present invention.

Referring to FIG. 33, a cross-sectional view after the third mask layer 108 and the fourth mask layer 106 are etched and the spacers 118, the first mask layer 114, the second memorization layer 112, and the second mask layer 110 are removed. This view shows an opening in the third mask layer 108 and the fourth mask layer 106 over the removable fin hard mask to be removed later in the process. This view also shows the cutting mask 104 exposed at the bottom of the opening.

Figure 34:
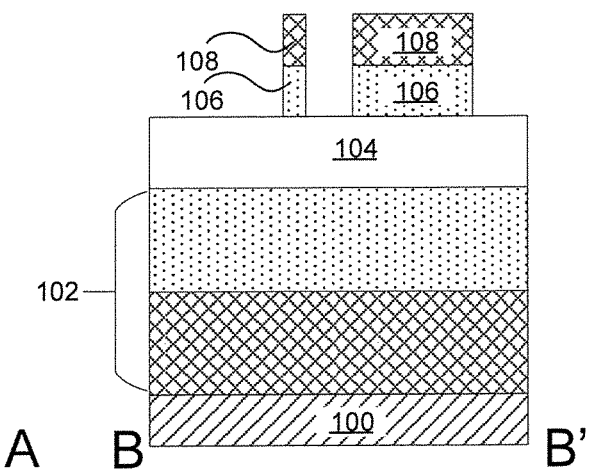
FIG. 34 is a cross-sectional view showing the material stack of FIG. 31 after having a third dielectric layer and a fourth dielectric layer etched and the spacers, the second amorphous layer, the first dielectric layer, and the second dielectric layer removed, in accordance with an embodiment of the present invention.

Referring to FIG. 34, a cross-sectional view after the third mask layer 108 and the fourth mask layer 106 are etched and the spacers 118, the first mask layer 114, the second memorization layer 112, and the second mask layer 110 are removed. This view shows that the remainder of the third mask layer 108 and the fourth mask layer 106 have two widths. A first width like the width of the removed spacers 118 and the second width like the width of the removed cutting mask 122. The second width of the third mask layer 108 and the fourth mask layer 106 can be the length of the larger fin at the end of the process.

Figure 35:
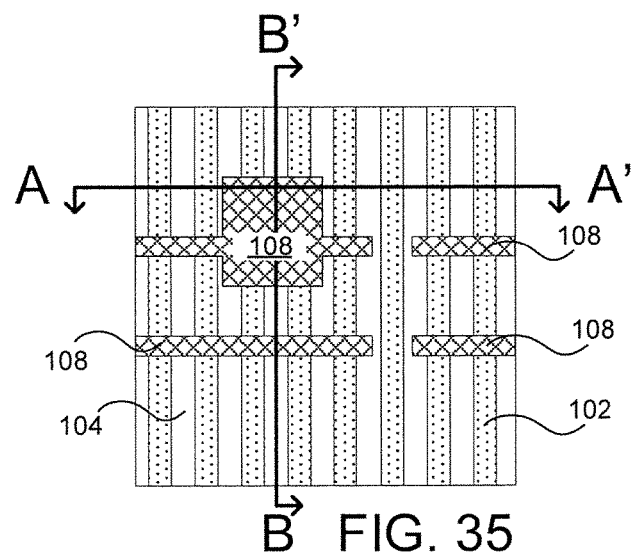
FIG. 35 is a top view showing the material stack of FIG. 32 after having a cutting mask etched to expose a removable fin hard mask, in accordance with an embodiment of the present invention.

Referring to FIG. 35, the cutting mask 104 is etched to expose the removable fin hard mask. The cutting mask 104 can be etched back to expose the removable fin hard mask that will be removed at the end of the process. The cutting mask 104 can be etched back utilizing the third mask layer 108 and the fourth mask layer 106 as a pattern to only expose the removable fin hard mask. The cutting mask 104 can be etched with an anisotropic etch process. In one example, OPLs may be etched using an etch chemistry of $N_2/H_2$ and/or HBr/He and/or $CO/CO_2$ and/or $CO/SO_2$. The anisotropic etch removes enough cutting mask 104 to expose the removable fin hard mask but does not remove all the cutting mask 104.

Figures 36, 37:
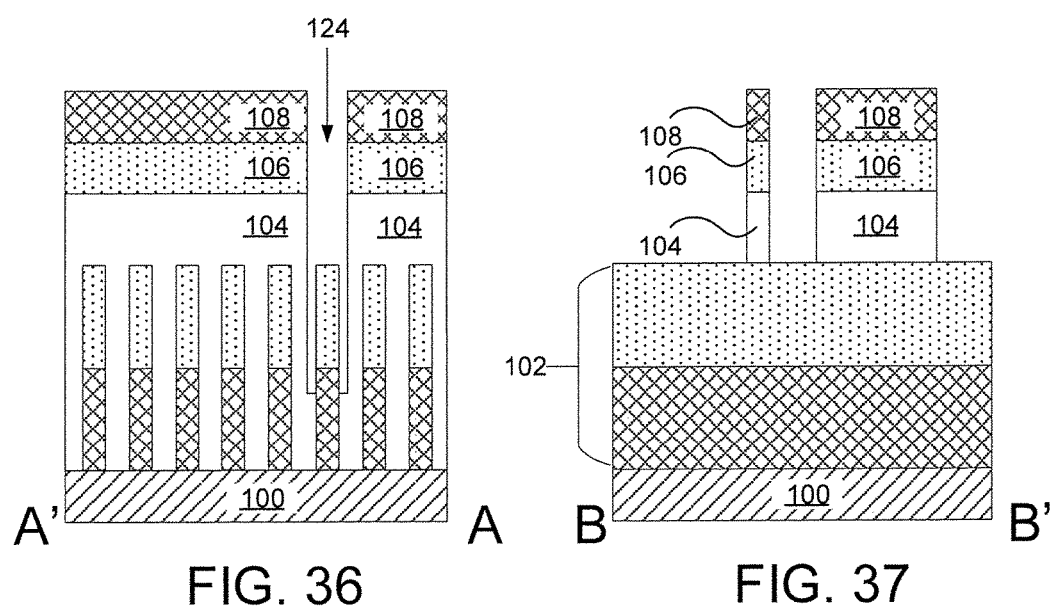
FIG. 36 is a cross-sectional view showing the material stack of FIG. 33 after having the cutting mask etched to expose the removable fin hard mask, in accordance with an embodiment of the present invention.
FIG. 37 is a cross-sectional view showing the material stack of FIG. 34 after having the cutting mask etched to expose the removable fin hard mask, in accordance with an embodiment of the present invention.

Referring to FIG. 36, a cross-sectional view after the cutting mask 104 is etched to expose the removable fin hard mask. This view shows an opening 124 in the third mask layer 108 and the fourth mask layer 106 over the removable fin hard mask to be removed later in the process. This view also shows the cutting mask 104 partially removed at the bottom of the opening 124, exposing the removable fin hard mask to be removed later in the process but not exposing the substrate 100.

Referring to FIG. 37, a cross-sectional view after the cutting mask 104 is etched to expose the fin hard masks 102. This view shows that the remainder of the third mask layer 108, the fourth mask layer 106, and the cutting mask 104 have two widths. A first width like the width of the removed spacers 118 and the second width like the width of the removed cutting mask 122. The second width of the third mask layer 108, the fourth mask layer 106, and the cutting mask 104 can be the length of the larger fin at the end of the process. This view also shows that the top of the fin hard masks 102 are exposed after the cutting mask 104 is etched.

Referring to FIG. 38, the removable fin hard mask, the third mask layer 108, and the fourth mask layer 106 are removed. The removable fin hard mask, the third mask layer 108, and the fourth mask layer 106 can be removed with an anisotropic etch process. Etch chemistries for removing the removable fin hard mask, the third mask layer 108, and the fourth mask layer 106 can be generally based on $CF_x$ species, such as $CH_3F$. The anisotropic etch process removes the removable fin hard mask, the third mask layer 108, and the fourth mask layer 106 to expose the cutting mask 104 and the substrate 100.

Referring to FIG. 39, a cross-sectional view after the removable fin hard mask, the third mask layer 108, and the fourth mask layer 106 are removed. This view shows an opening 126 in the cutting mask 104 exposing the substrate 100 after the removable fin hard mask was removed.

Referring to FIG. 40, a cross-sectional view after the removable fin hard mask, the third mask layer 108, and the fourth mask layer 106 are removed. This view shows that the cutting mask 104 and the fin hard masks 102 have two widths. A first width like the width of the removed spacers 118 and the second width like the width of the removed cutting mask 122. The second width of the cutting mask 104 and fin hard masks 102 can be the length of the larger fin at the end of the process. This view also shows that the substrate can be exposed when the removable fin hard mask is removed.

Figure 41:
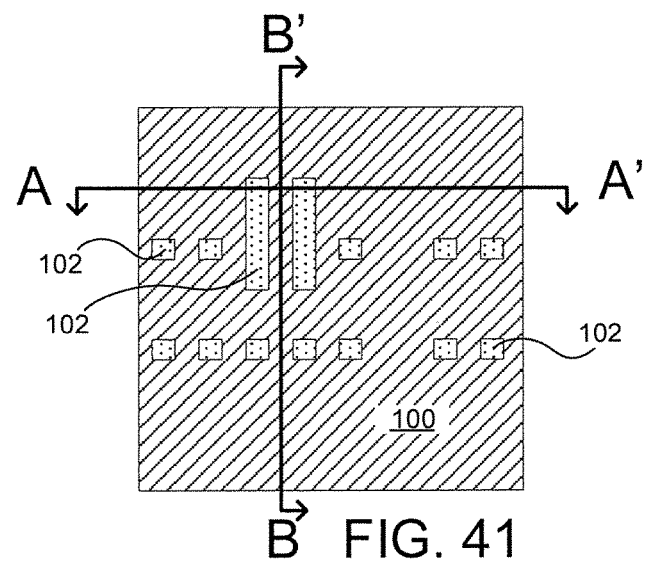
FIG. 41 is a top view showing the material stack of FIG. 38 after having the cutting mask removed, in accordance with an embodiment of the present invention.

Referring to FIG. 41, the cutting mask is removed to expose short fin lengths and long fin lengths. The cutting mask 104 can be removed to expose the fin hard masks 102. The cutting mask 104 can be removed with an anisotropic etch process. In one example, OPLs may be etched using an etch chemistry of $N_2/H_2$ and/or HBr/He and/or $CO/CO_2$ and/or $CO/SO_2$. The anisotropic etch removes the remainder of the cutting mask 104 to expose the fin hard masks 102 and the substrate 100. The fin hard masks 102 can have two fin lengths.

Figures 42, 43:
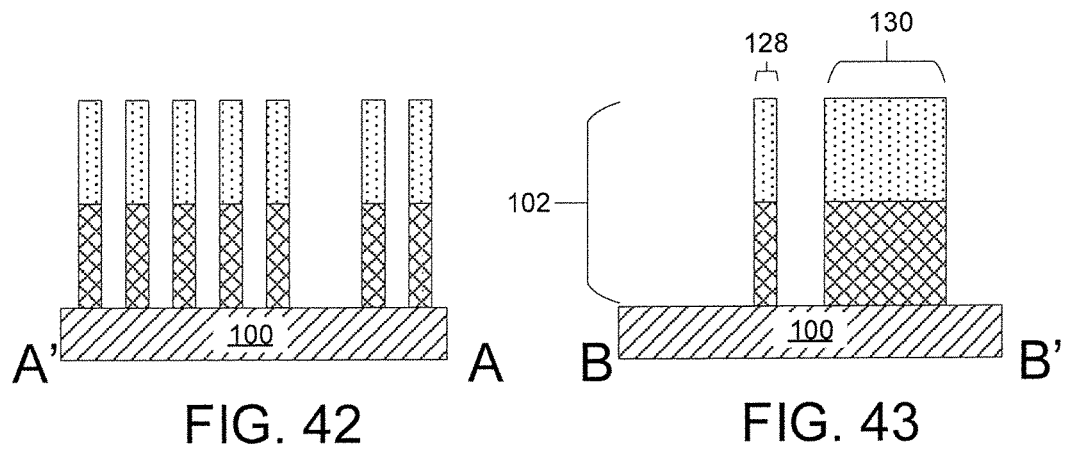
FIG. 42 is a cross-sectional view showing the material stack of FIG. 39 after having the cutting mask removed, in accordance with an embodiment of the present invention.
FIG. 43 is a cross-sectional view showing the material stack of FIG. 40 after having the cutting mask removed, in accordance with an embodiment of the present invention.

Referring to FIG. 42, a cross-sectional view after the cutting mask is removed to expose the short fin lengths and the long fin lengths. This view shows the fins after the cutting mask 104 was removed.

Referring to FIG. 43, a cross-sectional view after the cutting mask is removed to expose the short fin lengths and the long fin lengths. This view shows the fin hard masks 102 after the cutting mask 104 was removed. A first width like the width of the removed spacers 118 and the second width like the width of the removed cutting mask 122. The first width of the fin hard masks 102 can be a short fin 128. The second width of the fin hard masks 102 can be the length of a large fin 130. This view also shows that the substrate can be exposed when the fin hard masks 102 were etched.

Having described preferred embodiments of a VTFET with two or more gate lengths and a method for producing the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming multiple fin lengths, comprising:
   forming a material stack on vertical fins, the material stack including a plurality of mask layers, a memorization layer, and a first cutting mask;
   forming a plurality of mandrels on the material stack, the mandrels width being a part of a length of long fins;
   forming spacers along the plurality of mandrels, the spacers width being a length of short fins;
   depositing and patterning a second cutting mask over one or more of the plurality of mandrels;
   removing one or more of the plurality of mandrels exposed through the second cutting mask;
   removing the second cutting mask;
   patterning the material stack to form the long fins and the short fins below the spacers; and
   cutting the vertical fins with the pattern of the material stack to form the short fins and the long fins.

2. The method as recited in claim 1, wherein the second cutting mask includes a hard mask and an etch mask.

3. The method as recited in claim 2, wherein the hard mask includes silicon-containing antireflective coating (SiArc).

4. The method as recited in claim 2, wherein the etch mask includes an organic planarization layer (OPL).

5. The method as recited in claim 1, wherein the patterning step includes depositing and patterning a third cutting mask on the material stack with the third cutting mask width extending a length of the long fin.

6. The method as recited in claim 5, wherein the extended length of the long fin is for a not nominal gate length device.

7. The method as recited in claim 5, wherein the vertical fins include short fins, long fins, and extended long fins.

8. The method as recited in claim 1, wherein the patterning step includes a plurality of etch processes to pattern and remove one or more of the plurality of mask layers, the memorization layer, and the first cutting mask.

9. The method as recited in claim 1, wherein a length of the long fins is a width of the mandrel plus the widths of two spacers.

10. A method for forming multiple fin lengths, comprising:
    forming a material stack on vertical fins, the material stack including a plurality of mask layers, a plurality of memorization layers, and a first cutting mask;
    forming a plurality of mandrels on the material stack;
    etching a first memorization layer with a pattern formed by the plurality of mandrels;
    removing the plurality of mandrels;
    forming spacers along the first memorization layer, the spacers width being a length of short fins;
    removing the first memorization layer;
    depositing and patterning a second cutting mask over one or more of the spacers, the second cutting masks width being a length of long fins;
    patterning the material stack to form the short fins below the spacers and the long fins;

cutting the vertical fins with the pattern of the material stack to form the short fins and the long fins; and removing the material stack.

11. The method as recited in claim 10, wherein the forming the spacers step includes conformally deposition the spacer with a thickness of the length of the short fin.

12. The method as recited in claim 10, wherein the patterning step includes a plurality of etch processes to the plurality of mask layers and the plurality of memorization layers.

13. The method as recited in claim 12, wherein the plurality of etch processes include reactive ion etching.

14. The method as recited in claim 10, wherein the patterning step includes removing one or more of the vertical fins.

15. The method as recited in claim 10, wherein the plurality of mask layers includes an alternating stack of dielectric layers.

16. The method as recited in claim 15, wherein the alternating stack of dielectric layers alternate between oxides and nitrides.

17. The method as recited in claim 10, wherein the patterning step includes depositing and patterning a third cutting mask on the material stack with the third cutting masks width being a length of an extended long fin.

18. The method as recited in claim 10, wherein the vertical fins include short fins, long fins, and extended long fins.

\* \* \* \* \*